(12) United States Patent
Hsu et al.

(10) Patent No.: US 10,312,430 B2
(45) Date of Patent: Jun. 4, 2019

(54) METHOD OF MANUFACTURING PIEZOELECTRIC ELEMENT AND PIEZOELECTRIC SUBSTRATE

(71) Applicants: Interface Optoelectronics (ShenZhen) Co., Ltd., Shenzhen (CN); General Interface Solution Limited, Miaoli County (TW)

(72) Inventors: Chen-Chu Hsu, Guangdong (CN); Ying-Hung Tsai, Guangdong (CN); Wei-Chung Chuang, Guangdong (CN); Somnath Mondal, Guangdong (CN)

(73) Assignees: INTERFACE OPTOELECTRONICS (SHENZHEN) CO., LTD., Shenzhen (CN); GENERAL INTERFACE SOLUTION LIMITED, Miaoli County (TW)

(*) Notice: Subject to any disclaimer, the term of this patent is extended or adjusted under 35 U.S.C. 154(b) by 437 days.

(21) Appl. No.: 15/059,318

(22) Filed: Mar. 3, 2016

(65) Prior Publication Data
US 2017/0133582 A1 May 11, 2017

(30) Foreign Application Priority Data

Nov. 9, 2015 (CN) .......................... 2015 1 0760261

(51) Int. Cl.
*H01L 41/25* (2013.01)
*H01L 41/319* (2013.01)
(Continued)

(52) U.S. Cl.
CPC ............ *H01L 41/25* (2013.01); *H01L 41/053* (2013.01); *H01L 41/0805* (2013.01); *H01L 41/0815* (2013.01); *H01L 41/314* (2013.01); *H01L 41/316* (2013.01); *H01L 41/317* (2013.01); *H01L 41/319* (2013.01); *H01L 41/331* (2013.01); *H01L 41/193* (2013.01); *H03H 9/132* (2013.01); *H05K 3/1225* (2013.01); *Y10T 29/42* (2015.01)

(58) Field of Classification Search
CPC ............ H01L 41/053; H01L 41/0805; H01L 41/0815; H01L 41/193; H01L 41/25; H01L 41/317; H01L 41/331; H01L 41/314; H01L 41/316; H01L 41/319; H05K 3/1225; H03H 9/132; Y10T 29/42
See application file for complete search history.

(56) References Cited

U.S. PATENT DOCUMENTS

| 5,499,756 | A | * | 3/1996 | Banerji | ................ | H05K 3/1225 228/214 |
| 2010/0148636 | A1 | * | 6/2010 | Nishihara | .............. | H03H 9/132 310/365 |
| 2011/0050049 | A1 | * | 3/2011 | Shimizu | .................. | Y10T 29/42 310/367 |

FOREIGN PATENT DOCUMENTS

JP          2012114156 A  *  6/2012

* cited by examiner

*Primary Examiner* — A. Dexter Tugbang
(74) *Attorney, Agent, or Firm* — CKC & Partners Co., LLC

(57) ABSTRACT

A method of manufacturing a piezoelectric element includes: forming a patterned mask layer over a substrate, in which the patterned mask layer has an opening exposing a portion of the substrate; forming a piezoelectric element in the opening; and removing the patterned mask layer to obtain the piezoelectric element, in which the piezoelectric element has a central portion and a peripheral portion adjacent to the central portion, and the peripheral portion has a maximum height greater than a height of the central portion.

5 Claims, 2 Drawing Sheets

(51) Int. Cl.
  *H01L 41/316*    (2013.01)
  *H01L 41/314*    (2013.01)
  *H01L 41/053*    (2006.01)
  *H01L 41/08*     (2006.01)
  *H01L 41/317*    (2013.01)
  *H01L 41/331*    (2013.01)
  *H05K 3/12*          (2006.01)
  *H03H 9/13*          (2006.01)
  *H01L 41/193*        (2006.01)

METHOD OF MANUFACTURING PIEZOELECTRIC ELEMENT AND PIEZOELECTRIC SUBSTRATE

RELATED APPLICATIONS

This application claims priority to Chinese Application Serial Number 201510760261.8, filed Nov. 9, 2015, which is herein incorporated by reference.

BACKGROUND

Field of Invention

The present disclosure relates to a method of manufacturing a piezoelectric element and a piezoelectric substrate.

Description of Related Art

Generally, a film is formed and then cut or punched to form a plurality of current piezoelectric elements. Next, the piezoelectric elements are adhered to a substrate. However, an adhesive is required to adhere the piezoelectric elements formed by cutting or punching to the substrate. The adhesion process may cause a decrease of product yield or even produce other negative effects. For example, the adhesion process may result in an increase of thickness of the product or affect acoustic impedance thereof. In addition, during the adhesion process, poor bonding, laminating dislocation or other process issues may occur. Therefore, how to avoid those problems is an important issue is this field.

SUMMARY

In order to solve the problems described in the related art, the present disclosure provides a method of manufacturing a piezoelectric element, in which the piezoelectric element is formed over the substrate using a patterned mask layer, and thus there is no need of an additional adhesion process to adhere the piezoelectric element to the substrate. As such, the problems due to the adhesion process described in the related art will not occur.

The present disclosure provides a method of manufacturing a piezoelectric element including: forming a patterned mask layer over a substrate, in which the patterned mask layer has an opening exposing a portion of the substrate; forming a piezoelectric element in the opening; and removing the patterned mask layer to obtain the piezoelectric element, in which the piezoelectric element has a central portion and a peripheral portion adjacent to the central portion, and the peripheral portion has a maximum height greater than a height of the central portion.

According to some embodiments of the present disclosure, forming the piezoelectric element in the opening includes: filling a piezoelectric material solution in the opening; and solidifying the piezoelectric material solution to form the piezoelectric element.

According to some embodiments of the present disclosure, the piezoelectric material solution has a height less than a depth of the opening.

According to some embodiments of the present disclosure, the patterned mask layer includes a plastic material layer and an adhesive layer between the plastic material layer and the substrate.

According to some embodiments of the present disclosure, the patterned mask layer includes polyethylene terephthalate, polyimide, polycarbonate (PC), polyethylene (PE), polymethyl methacrylate (PMMA), metal, alloy, silicon or a combination thereof.

The present disclosure further provides a piezoelectric substrate including a substrate and a piezoelectric element. The piezoelectric element is over the substrate, in which the piezoelectric element has a central portion and a peripheral portion adjacent to the central portion, and the peripheral portion has a maximum height greater than a height of the central portion.

According to some embodiments of the present disclosure, a height of a sidewall of the peripheral portion toward the central portion is increased and then decreased.

According to some embodiments of the present disclosure, an included angle between a sidewall of the peripheral portion and a surface of the substrate is in a range of 40° to 100°.

According to some embodiments of the present disclosure, the maximum height of the peripheral portion is twice to twenty one times the height of the central portion.

BRIEF DESCRIPTION OF THE DRAWINGS

The invention can be more fully understood by reading the following detailed description of the embodiment, with reference made to the accompanying drawings as follows.

DETAILED DESCRIPTION

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

As mentioned in the related art, an adhesive is required to adhere piezoelectric elements formed by cutting or punching to a substrate. However, the adhesion process may cause a decrease of product yield or even produce other negative effects. Therefore, the present disclosure provides a method of manufacturing a piezoelectric element, in which the piezoelectric element is formed over the substrate using a patterned mask layer, and thus there is no need of an additional adhesion process to adhere the piezoelectric element to the substrate. As such, the problems due to the adhesion process described in the related art will not occur.

Figure 1A:
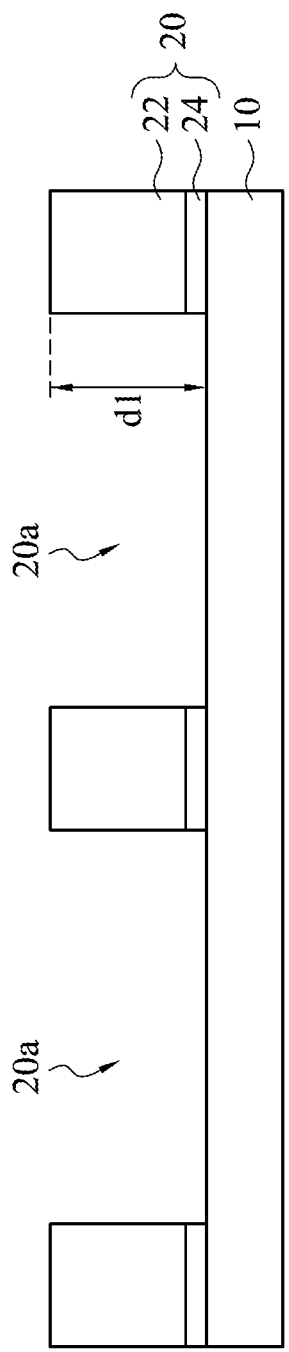
FIGS. 1A-1D are cross-sectional views at various stages of manufacturing a piezoelectric element according to some embodiments of the present disclosure.

FIGS. 1A-1D are cross-sectional views at various stages of manufacturing a piezoelectric element according to some embodiments of the present disclosure. Referring to FIG. 1A, a substrate 10 is provided. In some embodiments, the substrate 10 is made of glass, quartz, transparent polymer material or other suitable materials.

Next, a patterned mask layer 20 is formed over the substrate 10, as shown in FIG. 1A. The patterned mask layer 20 has an opening 20a exposing a portion of the substrate 10. In other words, the opening 20a is a through hole. In some embodiments, the patterned mask layer 20 has a plurality of openings 20a, and each of the openings 20a exposes a portion of the substrate 10. In some embodiments, a cut or punch process is performed on a complete mask layer (not shown) to form the patterned mask layer 20, and the patterned mask layer 20 is then adhered to the substrate 10 to form the structure shown in FIG. 1A. In some embodiments, the patterned mask layer 20 includes polyethylene terephthalate, polyimide, polycarbonate (PC), polyethylene (PE), polymethyl methacrylate (PMMA), metal, alloy, silicon or a combination thereof. In some embodiments, the metal or alloy includes nickel, chromium, aluminum, molybdenum, neodymium, titanium, copper, silver, gold, zinc, indium or gallium.

In some embodiments, as shown in FIG. 1A, the patterned mask layer 20 includes a plastic material layer 22 and an adhesive layer 24, and the adhesive layer 24 is disposed between the plastic material layer 22 and the substrate 10. In some embodiments, the plastic material layer 22 includes polyethylene terephthalate, polycarbonate (PC), polyethylene (PE), polymethyl methacrylate (PMMA) or a combination thereof. In some embodiments, the adhesive layer 24 includes polyurethane, polyvinyl alcohol, epoxy, acrylate copolymer, thermoplastic polyurethane, chlorinated polypropylene, vinyl acetate or a combination thereof. In some embodiments, the plastic material layer 22 has a thickness higher than that of center of a piezoelectric material solution. In some embodiments, the adhesive layer 24 has a thickness less than or equal to 25 microns.

Figure 1B:
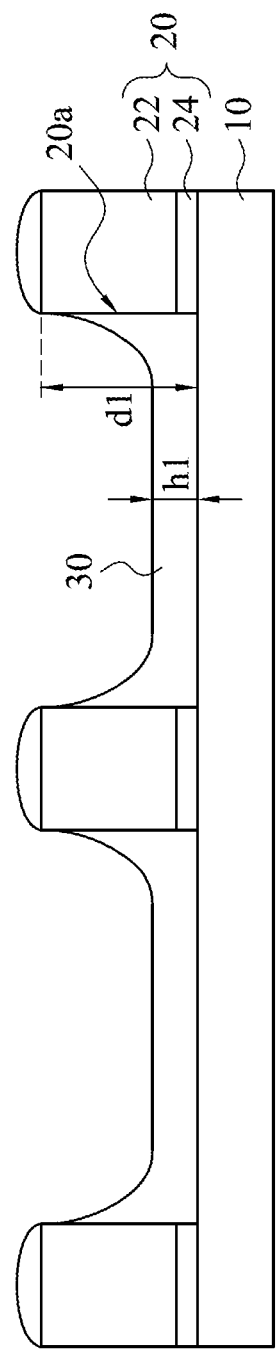
Figure 1C:
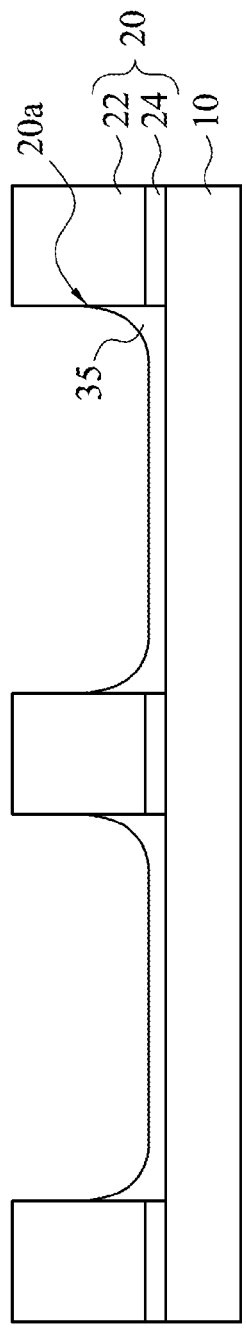

Referring to FIGS. 1B-1C, a piezoelectric element 35 is formed in the opening 20a. Specifically, as shown in FIG. 1B, a piezoelectric material solution 30 is filled in the opening 20a. In some embodiments, the piezoelectric material solution 30 includes fluorine-based resin and a solvent. In some embodiments, the fluorine-based resin is vinylidene fluoride-tetrafluoroethylene copolymer, vinylidene fluoride-trifluoroethylene copolymer, polyvinylidene fluoride or a combination thereof. In some embodiments, the solvent is dimethylformamide (DMF), methyl ethyl ketone (MEK), acetone, N-methylpyrrolidone (NMP), dimethylacetamide (DMAc) or a combination thereof. In some embodiments, the piezoelectric material solution 30 has a solid content in a range of 5% to 40%. In some embodiments, the piezoelectric material solution 30 further includes nano-carbon, such as carbon nanotube, carbon nano fiber, carbon nanosphere, graphene or a combination thereof.

In some embodiments, as shown in FIG. 1B, the piezoelectric material solution 30 in the opening 20a has a height h1 in a range of 70 microns to 110 microns. The term "height h1" herein refers to the height of the piezoelectric material solution 30 in center of the opening 20a rather than the height thereof near the patterned mask layer 20. In some embodiments, the height h1 of the piezoelectric material solution 30 is less than a depth d1 of the opening 20a.

It is noteworthy that, if the patterned mask layer is a whole adhesive layer (e.g., peelable adhesive layer), after the piezoelectric material solution 30 is filled in the opening 20a, the adhesive layer may be dissolved by the solvent of the piezoelectric material solution 30 to form a same film layer, which will result in negative effects on subsequent processes. Therefore, in some embodiments of the present disclosure, the patterned mask layer 20 includes non-adhesive polyethylene terephthalate, polyimide, metal, alloy, silicon or a combination thereof to avoid those issues.

Afterwards, as shown in FIGS. 1B-1C, the piezoelectric material solution 30 is solidified to form a piezoelectric element 35. In some embodiments, a curing process is performed on the piezoelectric material solution 30 to avoid liquidity. Temperature(s) of the curing process is selected based on the selection of the piezoelectric material.

Figure 1D:
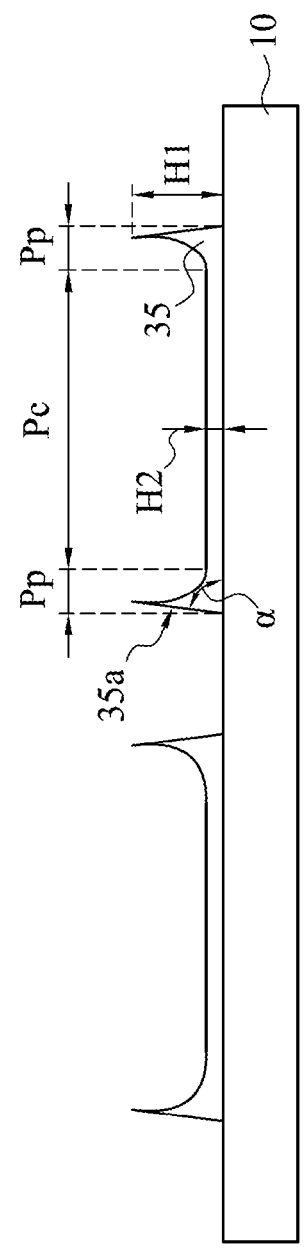

Referring to FIGS. 1C-1D, the patterned mask layer 20 is removed to obtain the piezoelectric element 35 over the substrate 10. In some embodiments, after the patterned mask layer 20 is removed, another curing process is performed. In other words, the curing process may be once or segmented performed.

As mentioned above, the piezoelectric element 35 is directly formed over the substrate 10, and thus there is no need of an additional adhesion process to adhere the piezoelectric element to the substrate. As such, the problems due to the adhesion process described in the related art will not occur.

The formed piezoelectric element 35 has a central portion Pc and a peripheral portion Pp. The peripheral portion Pp is adjacent to the central portion Pc. In some embodiments, in top view, the peripheral portion Pp surrounds the central portion Pc. The term "central portion Pc" herein refers to a portion of the piezoelectric element 35 with uniform thickness (e.g., the thickness is in a range of average thickness±10%). The term "peripheral portion Pp" herein refers to another portion of the piezoelectric element 35 at periphery of the central portion Pc.

In some embodiments, the peripheral portion Pp has a maximum height H1 greater than a height H2 of the central portion Pc, and it is because that during the piezoelectric material solution 30 is filled, a portion of the piezoelectric material solution 30 is distributed on a sidewall of the patterned mask layer 20, as shown in FIG. 1B.

The present disclosure further provides a piezoelectric substrate including a substrate and a piezoelectric element. Referring to FIG. 1D, the piezoelectric element 35 is over the substrate 10. In some embodiments, the piezoelectric element 35 is in contact with and adhered to the substrate 10.

The piezoelectric element 35 has a central portion Pc and a peripheral portion Pp. The peripheral portion Pp is adjacent to the central portion Pc. The peripheral portion Pp has a maximum height H1 greater than a height H2 of the central portion Pc. In some embodiments, the height H2 of the central portion Pc is in a range of 1 micron to 30 microns.

In some embodiments, a height (not marked) of a sidewall 35a of the peripheral portion Pp toward the central portion Pc is increased and then decreased.

In some embodiments, an included angle α between the sidewall 35a of the peripheral portion Pp and a surface of the substrate 10 is in a range of 40° to 100°. In some embodiments, the included angle α between the sidewall 35a of the peripheral portion Pp and the surface of the substrate 10 is in a range of 60° to 90°.

In some embodiments, the maximum height H1 of the peripheral portion Pp is twice to twenty one times the height H2 of the central portion Pc.

It will be apparent to those ordinarily skilled in the art that various modifications and variations may be made to the structure of the present disclosure without departing from the scope or spirit of the invention. In view of the foregoing, it is intended that the present disclosure cover modifications and variations thereof provided they fall within the scope of the following claims.

What is claimed is:

1. A method of manufacturing a piezoelectric element, comprising:
   providing a substrate;
   forming a patterned mask layer through a cut or punch process, wherein the patterned mask layer has an opening;
   adhering the patterned mask layer to the substrate, wherein the opening exposes a portion of the substrate;
   forming a piezoelectric element on the portion of the substrate; and removing the patterned mask layer to obtain the piezoelectric element, wherein the piezoelectric element has a central portion and a peripheral portion adjacent to the central portion, and the peripheral portion has a maximum height greater than a height of the central portion, and an included angle between a sidewall of the peripheral portion and a surface of the substrate is in a range of 40° to 100°.

2. The method of claim 1, wherein forming the piezoelectric element on the portion of the substrate comprises:
   filling a piezoelectric material solution in the opening; and
   solidifying the piezoelectric material solution to form the piezoelectric element.

3. The method of claim 2, wherein the piezoelectric material solution has a height less than a depth of the opening.

4. The method of claim 1, wherein the patterned mask layer comprises a plastic material layer and an adhesive layer between the plastic material layer and the substrate.

5. The method of claim 1, wherein the patterned mask layer comprises polyethylene terephthalate, polyimide, polycarbonate (PC), polyethylene (PE), polymethyl methacrylate (PMMA), metal, alloy, or silicon.

* * * * *